United States Patent [19]
Matsumura et al.

[11] Patent Number: 5,663,019
[45] Date of Patent: Sep. 2, 1997

[54] PROCESS FOR PRODUCING MULTICOLOR DISPLAY

[75] Inventors: Akira Matsumura, Hirakata; Masashi Ohata, Neyagawa; Atsushi Kawakami, Suita; Katsukiyo Ishikawa, Kuze-gun, all of Japan

[73] Assignee: Nippon Paint Co., Ltd., Osaka, Japan

[21] Appl. No.: 930,514
[22] PCT Filed: Jan. 29, 1992
[86] PCT No.: PCT/JP92/00079
  § 371 Date: Nov. 10, 1992
  § 102(e) Date: Nov. 10, 1992
[87] PCT Pub. No.: WO92/14172
  PCT Pub. Date: Aug. 20, 1992

[30] Foreign Application Priority Data
Feb. 1, 1991 [JP] Japan .................. 3-012018
[51] Int. Cl.$^6$ .......................................... G03F 9/00
[52] U.S. Cl. .................. 430/7; 430/270.1; 430/321; 430/324; 205/121; 349/106
[58] Field of Search ............... 430/7, 20, 326, 430/270.1, 321, 324; 359/67, 68; 205/120, 121, 122, 135

[56] References Cited

U.S. PATENT DOCUMENTS

| | | | |
|---|---|---|---|
| 4,491,628 | 1/1985 | Ito et al. | 430/270 |
| 4,902,592 | 2/1990 | Matsumura et al. | 430/7 |
| 5,186,801 | 2/1993 | Matsumura et al. | 430/7 |
| 5,214,542 | 5/1993 | Yamasita et al. | 430/7 |

OTHER PUBLICATIONS

Matsumura et al., Proceeding of Eurodisplay '90 (10. Int. Display Research Conference) 25 Sep. 1990, Amsterdam, pp. 240-243.
Allen, Photopolymerisation and Photoimaging Science and Technology, Chapter 3, p. 99 (1989).

*Primary Examiner*—John S. Chu
*Attorney, Agent, or Firm*—Wenderoth, Lind & Ponack

[57] ABSTRACT

A color filter is made easily and uniformly employing electrodeposition.

A specific positive type photosensitive resin layer is formed on a transparent electrode formed on a transparent substrate and, then a step for exposing and developing to obtain a desired pattern and a step for forming a desired colored layer by electrodeposition are repeated without peeling of the resin layer.

4 Claims, 1 Drawing Sheet

PROCESS FOR PRODUCING MULTICOLOR DISPLAY

TECHNICAL FIELD

The present invention relates to a process for producing a multicolor display used for multi-coloring display elements such as liquid crystal and the like.

BACKGROUND ART

As a method for forming a conventional color filter, there are various methods. Among them, a noticeable method is that employing electrodeposition. For example, in Japanese Patent Kokai No. 61-272720, there is disclosed a method comprising forming an electroconductive layer on a substrate, forming a positive type photosensitive coating thereon, exposing the coating, removing the exposed part and forming a desired colored layer by electrodeposition. In this method, since the positive type photosensitive coating is formed, only the exposed part is ideally solubilized in a developer, whereby, exposure and development can be repeatedly conducted regarding the remaining photosensitive coating.

However, regarding the positive type photosensitive coating, the part which is not subjected to light is modified by a developer and electrodeposition upon the first development and it becomes impossible to subject the remaining part to exposing and developing treatment again and, therefore, a commercially available quinonediazide can not be used. Accordingly, in this method, it is necessary to provide a peeling step at which all of a positive type photosensitive coating which has been exposed and developed is once peeled off and then the positive type photosensitive coating is formed again, which makes the method complicated.

Further, in Japanese Patent Kokai No. 61-279803, there is also disclosed a method for producing a color filter wherein exposure, development and electrodeposition are repeatedly conducted using a positive type photosensitive composition containing quinonediazide. In this case, quinonediazide is decomposed by heat and, therefore, it can not act as the positive type photosensitive coating after a step for making the second colored layer.

The present invention provides a process for producing a multicolor display by which a color filter having a fine colored pattern superior in thin-film uniformity is obtained by more simple production process.

DISCLOSURE OF THE INVENTION

That is, the present invention provides a process for producing a multicolor display which comprises the following steps:

(a) a step for forming a transparent electroconductive layer on a transparent substrate;

(b) a step for forming a layer of a positive type photosensitive resin composition comprising a polymer having a branched group which is unstable to an acid of a tert-butyl ester of a carboxylic acid or a tert-butyl carbonate of a phenol, and a photoinitiator which forms an acid upon exposure, on the transparent electroconductive layer;

(c) a step for placing a mask having a desired pattern on the photosensitive resin layer followed by exposure and development to expose part of the transparent electroconductive layer;

(d) a step for forming a desired colored layer on the exposed transparent electroconductive layer; and (e) a step for repeating the steps (c) and (d) a desired number of times.

As shown in FIG. 1 (A), a transparent electroconductive layer is firstly formed on a substrate 1. The substrate may be anyone which is normally used for a multicolor display and examples thereof include glass substrate, plastic substrate and the like. As the transparent electroconductive layer, for example, those containing tin oxide, indium oxide, antimony oxide and the like as a main component are suitably used. The transparent electroconductive layer is formed by an art-known method such as deposition, sputtering and the like.

Then, a positive type photosensitive resin layer 3 is formed on the electroconductive layer 2, as shown in FIG. 1 (B). The positive type photosensitive resin layer is a photosensitive resin layer which was once applied and it can be exposed and developed plural times. For example, it is a positive type photosensitive resin composition comprising a polymer having a branched group which is unstable to an acid composed of a tert-butyl ester of a carboxylic acid or a tert-butyl carbonate of a phenol (U.S. Pat. No. 4,491,628 and Japanese Patent Kokai No. 2-309358). In this case, the polymer having a branched group which is unstable to an acid is a polymer or copolymer of a polymerizable compound having a branched group which is unstable to the above acid. As the polymerizable compound having a branched group which is unstable to the acid, for example, there are p-t-butoxycarbonyloxy-α-methylstyrene, p-t-butoxycarbonyloxystyrene, t-butyl-p-vinyl benzoate, t-butyl-p-isopropenylphenyloxy acetate, t-butyl methacrylate and the like. Examples of the monomer which can be copolymerized with the above monomer include monoolefin and diolefin hydrocarbons. The photoinitiator which forms an acid by light irradiation (exposure) is generally onium salt, which has been known heretofore.

By placing a mask 4 having a desired pattern on the positive type photosensitive resin composition (FIG. 1 (C)) followed by exposure, it becomes possible to elute off the photosensitive resin composition layer at the exposed part. Then, the photosensitive resin composition is eluted off with a predetermined eluting solution to form a patterned substrate (FIG. 1 (D)). The mask and elution technique are known. The substrate is in the form that the electroconductive layer 2 is exposed at the position which must be colored, as shown in FIG. 1 (D). As shown in FIG. 1 (E), a colored layer 5 (e.g. red (R)) is formed by conducting electrodeposition in an electrodeposition bath with applying a current through the electroconductive layer 2. A synthesized polymer resin used as a membrane-forming component of the electrodeposition bath which is used in this method may be cationic, anionic or amphoionic resin, and examples thereof include various known resins such as acrylic resin, epoxy resin, urethane resin, polybutadiene resin, polyamide resins, carboxyl group-introduced polybutadiene, carboxyl group-introduced alkyd resin and the like. Further, some synthesized polymer resins having specific ionic character attack the electroconductive layer 2 and, therefore, it is necessary to select membrane-forming components by taking this into consideration.

The electrodeposition bath and other details are described in Japanese Patent Kokai No. 59-114592, Japanese Patent Application No. 62-46321 by the present inventors et al. (Japanese Patent Kokai No. 63-210901) and the like. The elecrodepositable paint may be any photopolymerizable or thermoset paint.

Then, by placing a positive mask 4 on the colored layer and the positive type photosensitive resin layer which are formed on the substrate 1 (FIG. 1 (F)) followed by exposure, the photosensitive resin composition layer at the exposed part is eluted off to obtain a patterned substrate (FIG. 1 (G)), according to the same manner as that described above.

Further, a colored layer 6 (e.g. green (G)) is formed by conducting electrodeposition in an electrodeposition bath with applying a current through the electroconductive layer 2, as shown in FIG. 1 (H). Then, by repeating steps shown in FIG. 1 (F) to FIG. 1 (H), a colored layer 7 (e.g. blue (B)) is formed [(FIG. 1 (I) to FIG. 1 (K)].

If necessary, a black matrix may be formed, in addition to blue, red and green colored layers. In this case, the total surface of the substrate wherein the colored layers (R, G and B) and the positive type photosensitive layer remain is exposed and further eluted to expose the electroconductive layer 2 other than the colored layers (R, G and B) (FIG. 1 (L)).

Then, as shown in FIG. 1 (M), a colored layer 8 (e.g. black) may be formed by conducting electrodeposition in an electrodeposition bath with applying a current through the electroconductive layer 2. Further, a black matrix may be formed by a method other than electrodeposition method.

According to the production process of the color filter of the present invention, a color filter having a colored layer in any arrangement and shape can be produced, regardless of the shape of the electroconductive layer.

In the present invention, it is necessary to design a mask used for the exposure in FIGS. 1 (C), 1 (F) and 1 (I) by taking arrangement and shape of the desired colored layer into consideration.

EXAMPLE

The following Examples further illustrate the present invention in detail but are not to be construed to limit the scope thereof.

Reference Example 1

Preparation of Positive Type Photosensitive Resin Composition

To 50 g of xylene containing 2.0 g of azobisisobutyronitrile, 65.0 g of t-butyl methacrylate, 20.0 g of butyl acrylate and 20.0 g of methyl methacrylate were added and the mixture was heated with stirring in a nitrogen flow at 60° C. for 10 hours. After cooling, the reaction product was diluted with tetrahydrofuran and rinsed with petroleum ether/methanol. The resulting polymer (93.0 g, yield of 93%) had a weight-average molecular weight (GPC) of 22,000. The polymer was dissolved in tetrahydrofuran so that an amount of solid material becomes 20% by weight and, further, triphenylsulfonium hexafluoroantimonate was added to the polymer in an amount of 20% by weight to obtain a positive type photosensitive resin composition.

Reference Example 2

Preparation of Cationic Photosensitive Electrodepositable Resin Composition for Forming Color Filter

|  | Blue | Green | Red | Black |
| --- | --- | --- | --- | --- |
| Cationic photosensitive electrodepositable resin composition | 995.0 | 995.0 | 995.0 | 992.5 |

-continued

|  | Blue | Green | Red | Black |
| --- | --- | --- | --- | --- |
| Phthalocyanine blue | 5.0 | — | — | — |
| Phthalocyanine green | — | 5.0 | — | — |
| Aza metal salt red pigment | — | — | 5.0 | — |
| Carbon black | — | — | — | 7.5 |
| Total amount | 1000.0 | 1000.0 | 1000.0 | 1000.0 |

A cationic photosensitive resin composition comprising 80 parts by weight of an organic polymer binder (weight-average molecular weight of 70,000) wherein each compound obtained by the equimolar reaction of N,N-diethylaminoethyl methacrylate, styrene, ethyl acrylate and p-hydroxybenzoic acid with glycidyl acrylate was copolymerized each other in a molar ratio of 3:2:4:1, 0.5 parts by weight of 2,2-dimethoxy-2-phenylacetophenone and 14.5 parts by weight of trimethylolpropane triacrylate was diluted with ethylene glycol monobutyl ether so that the volatile content becomes 80% and neutralized with 0.5 equivalent acetic acid and, then, the volatile content was adjusted to 10% with deionized water.

To the electrodepositable resin composition thus prepared, a pigment was formulated as described below to form cationic electrodepositable solutions of three colors.

Example 1

According to the same manner as that of a conventional technique, a transparent electroconductive membrane 2 of ITO (indium tin oxide) compound was formed on a glass substrate 1. A positive type photosensitive resin composition of Reference Example 1 was applied on the transparent electroconductive membrane 2 using a spinner followed by drying to form a positive type photosensitive resin composition layer 3 on the transparent electroconductive membrane.

Then, it was exposed to a high pressure mercury lamp through a mask having a predetermined pattern and heated at 100° C. for 3 minutes. After developing with an alkali solution, a salt was formed at the exposed part to elute off, which resulted in exposure of the surface of the transparent electroconductive layer 2. Then, the substrate 1 wherein the transparent electroconductive layer 2 was exposed was immersed in an electrodeposition bath of a red cationic photosensitive electrodepositable resin composition and a direct current of 5 volt was applied for 30 seconds using a transparent conductive layer as a negative electrode. Thereafter, the substrate was taken out and sufficiently rinsed with water. In this case, the electrodepositable composition was not deposited onto the positive type photosensitive resin composition on the transparent electroconductive membrane and was removed by rinsing with water. However, a polymer deposited on the electrode to which an electric current was applied became insoluble to water and, therefore, it could not be removed by rinsing with water. After rinsing and drying, a colored polymer layer having good transparency was formed on the transparent electrode.

Then, the substrate was exposed to a high pressure mercury lamp through a mask 4 having shifted pattern and heated at 100° C. for 3 minutes. After developing with an alkali solution, the surface of the transparent conductive membrane 2 was exposed, similarly. Then, the substrate 1, wherein the transparent electroconductive layer 2 was exposed and the red colored layer was formed, was immersed in an electrodeposition bath of a green cationic photosensitive electrodepositable resin composition and a direct current of 5 volt was applied for 45 seconds using the transparent conductive layer as a negative electrode. Thereafter, the substrate was taken out and sufficiently rinsed with water. In this case, a green electrodepositable composition was not deposited onto the positive type photosensitive resin composition and a red colored layer on the transparent conductive membrane and was removed by rinsing with water. After rinsing and drying, a green polymer membrane having good transparency was formed.

Further, the substrate was exposed through a mask 4 having a shifted pattern, heated and developed and, then, a blue electrodepositable composition was deposited by applying a direct current of 5 volt for 30 seconds. After rinsing and drying, a blue polymer membrane was formed, similarly.

The total surface of the substrate wherein the remainder of the positive type photosensitive resin composition as well as red, green and blue colored layers were formed was exposed to a high pressure mercury lamp. After developing with an alkali solution, the positive type photosensitive resin composition was eluted except the colored layer, which results in exposure of the surface of the transparent conductive membrane 4.

Then, black color electrodeposition was conducted by applying a direct current of 3 volt for 20 seconds. After rinsing and drying, a black colored layer was formed between the gap of the red, green and blue colored filters.

Finally, the total surface of the red, green and blue colored membranes formed on the transparent substrate was exposed at 200 mJ/cm$^2$ to cure the membranes.

The film thickness of the colored membrane was 2.0 microns.

Effect of the Invention

According to the present invention, a color filter can be formed only by forming a positive type photosensitive resin layer on a transparent electrode one time and, therefore, an inconvenient process such as peeling of a resist is not required.

Further, it becomes possible to form various colored filters having uniform film thickness and, therefore, color shading due to distribution of film thickness is eliminated, which results in excellent display image. Further, a transparent electrode exposed by developing a photosensitive resin layer is always fresh and is free from stain, and formation of a colored layer by electrodeposition is also advantageous.

Figure 1A:
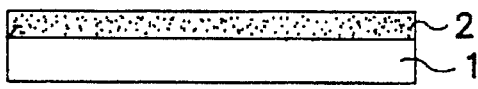
FIGS. 1 (A) to 1 (M) are flow sheets illustrating the process for producing a color filter of the present invention.
Figure 1B:
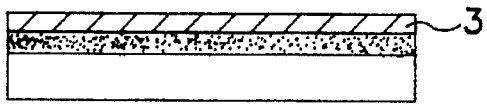
Figure 1C:
Figure 1D:
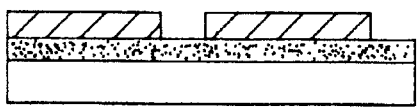
Figure 1E:
Figure 1F:
Figure 1G:
Figure 1H:
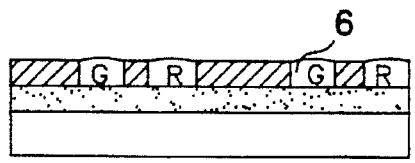
Figure 1I:
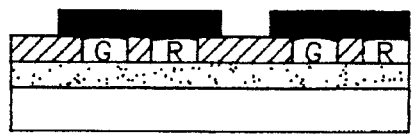
Figure 1J:
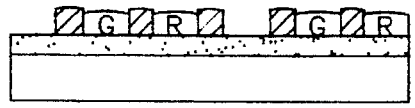
Figure 1K:
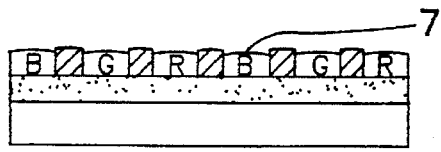
Figure 1L:
Figure 1M:
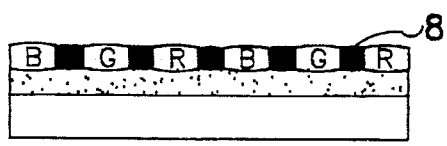

What is claimed is:

1. A process for producing a multicolor display which consists essentially of the following steps:

(a) a step for forming a transparent electroconductive layer on a transparent substrate;

(b) a step for forming a layer of a positive photosensitive resin composition comprising a polymer having a branched group which is unstable to an acid of a tert-butyl ester of a carboxylic acid or a tert-butyl carbonate of a phenol, and a photoinitiator which forms an acid upon exposure, on the transparent electroconductive layer;

(c) a step for placing a mask having a pattern on the photosensitive resin layer followed by exposure and development to expose part of the transparent electroconductive layer;

(d) a step for forming a colored layer on the exposed transparent electroconductive layer; and (e) a step for repeating the steps (c) and (d) such that a multicolor display is formed; and wherein a black matrix is present between a gap of colored patterns.

2. The process according to claim 1, wherein red, green and blue colored patterns are formed in coloring step (d) by electrodeposition.

3. The process according to claim 2, wherein the black matrix is present between a gap of red, green and blue colored patterns.

4. The process according to claim 3, wherein the black matrix is also formed by the steps (c) and (d).

* * * * *